(12) United States Patent
Durkot

(10) Patent No.: US 7,013,563 B2
(45) Date of Patent: Mar. 21, 2006

(54) METHOD OF TESTING SPACINGS IN PATTERN OF OPENINGS IN PCB CONDUCTIVE LAYER

(75) Inventor: John Durkot, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 340 days.

(21) Appl. No.: 10/616,932

(22) Filed: Jul. 11, 2003

(65) Prior Publication Data

US 2005/0005438 A1   Jan. 13, 2005

(51) Int. Cl.
*G01R 23/04* (2006.01)

(52) U.S. Cl. ............................ 29/852; 29/830; 29/846; 29/847; 324/158.1; 324/754; 324/765

(58) Field of Classification Search ................ 29/825, 29/829–834, 846–852; 174/250, 255, 262–266; 156/252–253; 324/765, 759, 754; 361/748
See application file for complete search history.

(56) References Cited

U.S. PATENT DOCUMENTS

| 4,487,654 A | * | 12/1984 | Coppin | 216/18 |
| 4,510,446 A | * | 4/1985 | Braun et al. | 324/766 |
| 5,357,194 A | * | 10/1994 | Ullman et al. | 324/754 |
| 5,369,491 A | | 11/1994 | Schneider | |
| 5,377,404 A | | 1/1995 | Berg | |
| 6,232,559 B1 | | 5/2001 | Janecek | |

* cited by examiner

*Primary Examiner*—Minh Trinh
(74) *Attorney, Agent, or Firm*—Hinman, Howard & Kattell, LLP; Lawrence R. Fraley

(57) ABSTRACT

A method for testing opening patterns in an active area of a PCB wherein two arrays of test patterns of apertured pads are analyzed following drilling therethrough in accordance with a specified manner. Specifically, the outer patterns are first tested and if failure results in one or more of said patterns, an inner array of patterns closer to the active area are then tested and, significantly, only the respective test pattern nearest the associated array of openings is used to determine whether said array of openings meets the designated spacing criteria.

11 Claims, 4 Drawing Sheets

METHOD OF TESTING SPACINGS IN PATTERN OF OPENINGS IN PCB CONDUCTIVE LAYER

TECHNICAL FIELD

The present invention relates to multi-layer printed circuit boards (PCBs) and particularly to methods of testing multi-layer PCBs for acceptability. In particular, the present invention relates to methods for detecting mis-aligned opening patterns in multi-layer PCBs.

BACKGROUND OF THE INVENTION

Multi-layer PCBs are usually formed from a plurality of layers of various materials. The materials are typically electrically insulating and electrically conducting, and are well known in the art. Typically, the layers are formed and various materials (e.g., circuitization) are deposited on the surface of one or more layers and/or various materials are introduced into portions of the various layers. Additionally, holes are formed through one or more of the layers. Such holes are often referred to as plated through holes (PTHs) which in turn provide electrical coupling between designated conductive layers in and on the PCB. After forming the layers, the layers may then be assembled into a multi-layer structure.

It is extremely important to know where the layers are relative to each other in the multi-layer structure. Also, it is important to know where structures in and/or on the layers are relative to structures in and/or on other layers in the multi-layer structure. For example, when forming PTHs in the multi-layer structure, it is important to know where the various layers, signal lines and other structures formed in and/or on the layers are relative to each other to ensure that the through holes are located in the correct, optimal position for successful functioning of the circuit board. Understandably, misalignment of but one of these PTHs can result in a malfunctioning final board product.

In the past, alignment, or registration, of layers of multi-layer circuit boards has been achieved through a variety of means. For example, X-rays have been used to detect the placement of various features in and/or on layers of multi-layer circuit boards. Additionally, physical means have been utilized, such as drilling holes in each layer of a multi-layer circuit board and then stacking the circuit boards on a pin. Additionally, indentations have been formed in the sides of circuit board layers to align the layers. Examples of various methods of measuring PCB layer alignment are described in the following U.S. Letters Patents:

| | |
|---|---|
| 4,510,446 | Braun et al |
| 5,369,491 | Schneider |
| 5,377,404 | Berg |
| 6,232,559 B1 | Janecek |

The present invention represents an improved method of testing multi-layered PCBs to be assured that the spacings (e.g., clearance holes and signal to PTH) in designated patterns of openings are precisely oriented vertically relative to one another, while assuring avoiding scrapping of tested products due to inappropriate test readings.

It is believed that such an invention will represent a significant advancement in the PCB manufacturing art.

OBJECTS AND SUMMARY OF THE INVENTION

It is a primary object of the invention to enhance the art of PCB manufacturing.

It is another object of the invention to provide a method of making PCBs which will result in significantly lower costs of such manufacture, namely by reducing scrap.

It is yet another object of the invention to provide such a method which can be performed in a facile manner.

These and other objects are attainable in accordance with one aspect of the invention wherein there is provided a method of testing spacings in at least one pattern of openings in at least one conductive layer of a multilayered printed circuit board (PCB) to determine if said spacings meet acceptable criteria. The method comprises providing a multilayered PCB including an active area having at least one internal conductive layer having at least one pattern of openings therein, providing a plurality of first patterns of apertured test pads spacedly positioned substantially along the outer periphery of the PCB externally of the active area, providing a plurality of second patterns of apertured test pads spacedly positioned substantially adjacent the active area of the multilayered PCB and closer to the active area than the plurality of first patterns of apertured pads, and drilling a plurality of holes through the plurality of first patterns of apertured test pads to determine if each of the plurality of first patterns meet a first acceptable tolerance value. A plurality of holes are also drilled through the plurality of second patterns of apertured test pads to determine if each of the plurality of second patterns meet a second acceptable tolerance value, and the second acceptable tolerance value is compared to an acceptable tolerance value assigned to the at least one pattern of openings in the active area of the PCB only if one or more of the first patterns of the apertured test pads fail to meet the first acceptable tolerance value. The patterns of openings in the active area are analyzed to determine if these meet the acceptable criteria based solely on whether the second pattern of apertured test pads nearest the pattern of openings meets the second acceptable tolerance value and not on whether others (more distant) of the second patterns of apertured test pads meet the second acceptable tolerance value.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

Figure 1:
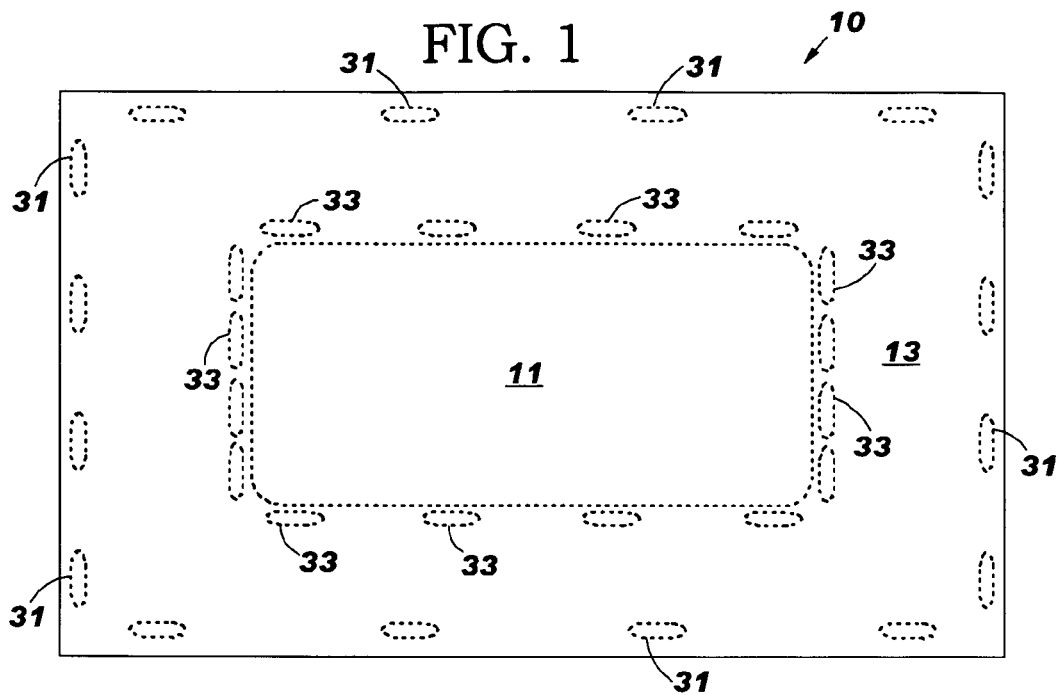
FIG. 1 is a plan view of a multi-layered PCB during the initial stages of manufacture thereof.

In FIG. 1 there is seen a multi-layered printed circuit board 10 according to one embodiment of the invention, during the initial stages of formation thereof. Printed circuit board (PCB) 10 includes a "board active area" 11 therein, surrounded by a peripheral "test" region 13. In one example, the active area 11 is of rectangular configuration and may possess dimensions of about 20.0 inches by about 24.0 inches, respectively. With such an internal area, the corresponding outer surfaces of the rectangular, overall larger structure may be from about 24.0 inches to about 28.0 inches, thus leaving a peripheral test area having a width of about 2.0 inches. It is understood that in the finished product, the illustrated active area will be the functioning area of the board, e.g., electronic components located thereon and/or coupled thereto, including patterns of openings or the like for having components pinned therein or wherein such openings are plated through holes (PTHs) designed to interconnect various layers of the board, etc. The PCB shown in FIG. 1 preferably includes a plurality of internal conductive layers separated by respective layers of dielectric material. Such conductive layers and dielectric materials are known in the art. Several examples thereof may be utilized in making PCB 10.

Figure 8:
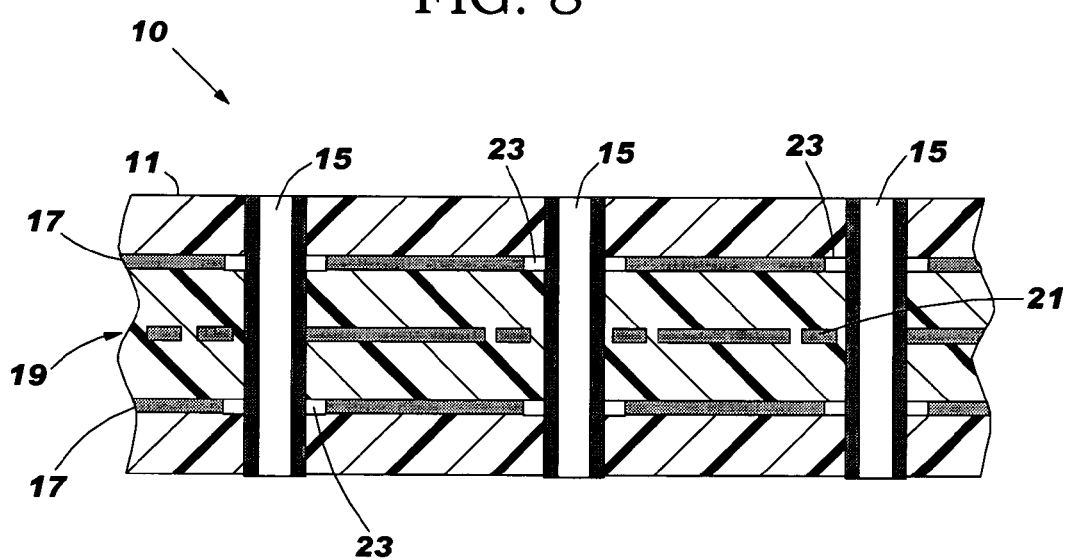
FIG. 8 is a partial side elevational view, in section, showing PTHs extending through the finished PCB and the spacings thereof relative to both a power plane (clearance openings) and signal plane located within the PCB.

FIG. 8 represents a cross-sectional drawing of the active area 11 of board 10 showing such PTHs 15 and internal conductive layers such as a substantially solid power plane 17 (two are shown in FIG. 8) and a signal plane 19, typically comprised of several individual conductive signal lines 21 which, as is known, are typically arranged in predetermined patterns (often side-by-side) to provide various signal connections between corresponding components mounted on the board and coupled to the signal plane by one or more of the PTHs 15. The cross-section in FIG. 8 is only for illustration purposes and it is well understood that, typically, several internal conductive planes, both power and signal, are utilized in such a structure. In one example of the invention, a total of thirty such layers were utilized.

As also seen in FIG. 8, the relative positioning of each PTH to the corresponding internal layers is critical. For example, the internal power planes are typically of substantially solid, copper material and possess a plurality of clearance holes or the like 23 therein which, understandably, are not electrically coupled to selected ones of the PTHs 15. In FIG. 8, however, it is noted that the lower power plane 17 is coupled to the central PTH 15, as may be necessary depending on the operational requirements for board 10. Again, it must be emphasized that the relative spacing between these clearance holes and the eventual PTH formed therethrough is critical in order to produce an acceptable final board product. It is also understood that spacing between the individual signal lines 21 and PTHs 15 is also critical as too close positioning, including possible contact, could result in board failure. It is also seen in FIG. 8 that some portions of the signal layer may in turn be coupled to one or more of the PTHs 15, while other, separate signal lines remain critically spaced therefrom.

As understood from the teachings herein, a critical aspect of the present invention is to provide a testing procedure whereby patterns of openings such as those of clearance holes 23 or those for PTHs relative to signal lines 21 are effectively maintained at the minimal spacings required to assure a final, successfully operating board product. Because such multi-layered boards may possess thousands of such openings therein over the several conductive layers, maintaining such effective spacing is understandably an important, yet extremely difficult process. The present invention is able to do so in a facile manner while eliminating unnecessary scrap as was heretofore deemed necessary in other, related PCB testing and manufacturing operations. The invention thus represents a significant advancement in the art, and results in a substantial savings to both the PCB manufacturer and ultimate purchaser thereof.

In FIG. 1, the test area 13 is shown to include two different arrays of test patterns spacedly positioned thereon. The first array comprises patterns 31 (shown in phantom) positioned substantially along the outer periphery of board 10 as shown. In one embodiment, a total of sixteen patterns 31 may be utilized, each spaced apart a predetermined distance from one another. In addition, an array of second patterns 33 is also provided, each pattern also shown in phantom and spacedly positioned adjacent the periphery of the board's active area 11, and thus closer to the broadened openings and other contact sites within this area than the respective outer test pattern 31. For example, the test pattern shown with the numeral 33 to the right of area 11 in FIG. 1 is closer to area 11 than the outer test pattern shown by the numeral 31 to the right of pattern 33. As understood from the following, the purpose of these test patterns is to provide the PCB manufacturer with an indication of whether the internal patterns of openings in area 11 meet established criteria; that is, these openings are of sufficient spacing relative to internal signal lines and/or such openings are large enough (e.g., as in the case of the aforementioned clearance openings in FIG. 8).

Figure 2:
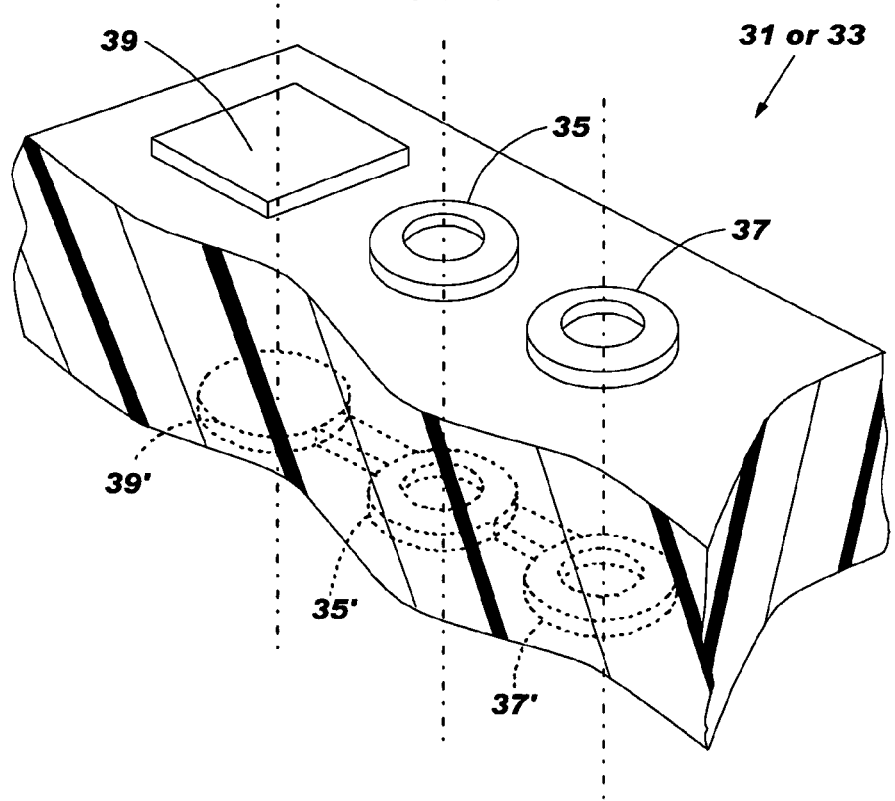
FIG. 2 is a much enlarged, partial perspective view showing one example of a pair of vertically aligned patterns of test pads for use in the method of the invention.
Figure 3:
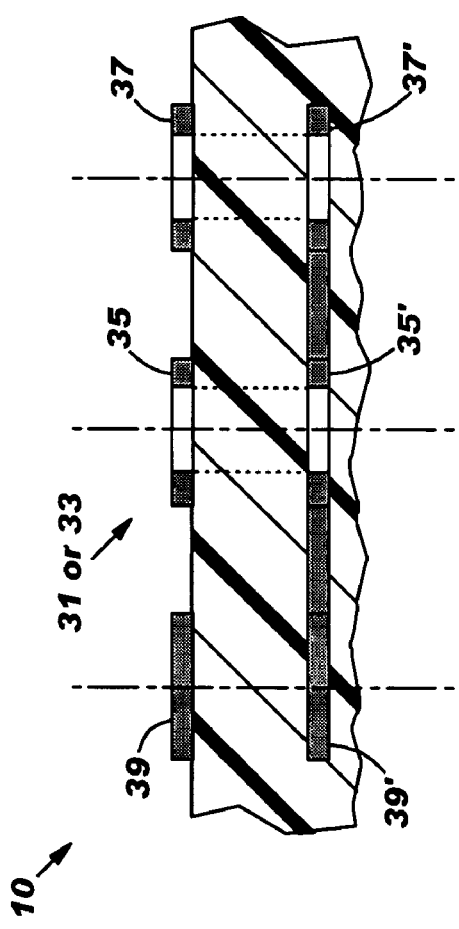
FIG. 3 is a partial side elevational view of the patterns of FIG. 2.
Figure 6:
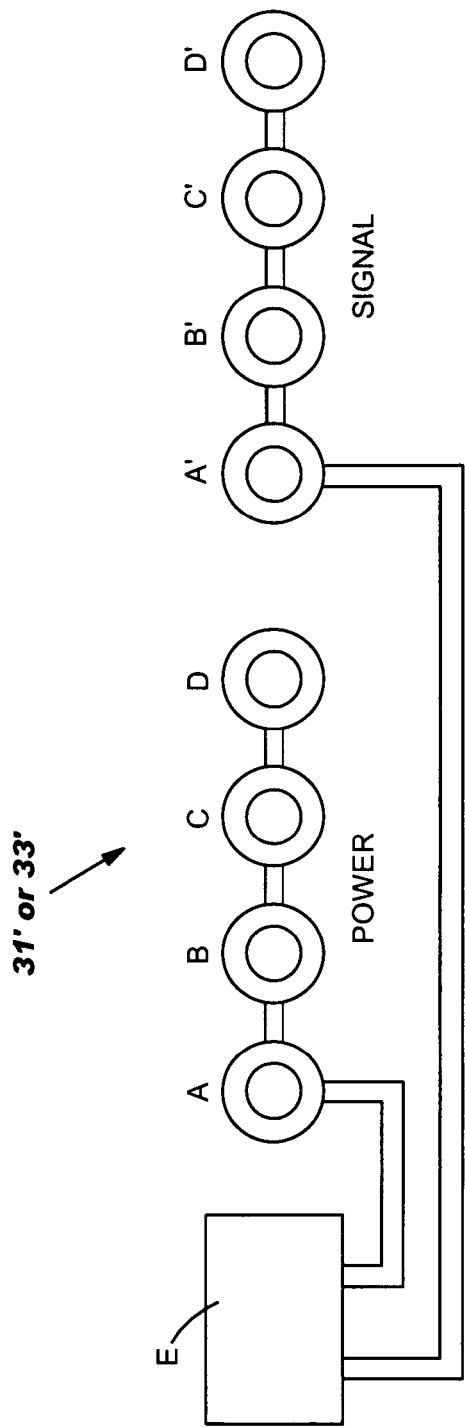
FIG. 6 is a plan view representing an example of a test pad pattern wherein tolerance values for two different opening patterns (e.g., power and signal) are attainable.

FIGS. 2 and 3 represent examples of each of the patterns 31 or 33, in their simplest form. Each pattern is shown to include a pair of apertured test pads 35 and 37, in addition to an auxiliary pad 39. The functional purpose of these pads is described below. In FIGS. 2 and 3, the pads 35, 37 and 39 are shown as being positioned on the upper, external surface of board 10 while a similar line of pads is located internally and represented by the numerals 35', 37'and 39', respectively. It is understood that there is an internal pattern of apertured test pads within board 10 for each conductive layer utilized. In a preferred embodiment, each annular, apertured pad 35 and 37 is comprised of copper, as is pad 39 and as are the internal corresponding pads. The number of pads shown in FIGS. 2 and 3 for each pattern is representative only and not meant to limit the invention. In a preferred embodiment, each pattern may include 11 or fewer such apertured pads, one example being to use eight such pads as shown in FIG. 6. The greater the number of pads, the greater the range of acceptable tolerance values that can be measured for the respective pattern. More description will be provided below with respect to FIG. 6.

It is seen in FIG. 2 that aperture 35 includes a larger opening therein than the corresponding apertured pad 37, while pad 39 is substantially solid. This is also true for the corresponding internal pads located immediately below these upper pads as well as those further within the board and not depicted here. As stated, the illustrations in FIGS. 2 and 3 are for illustration purposes only and not meant to limit the invention.

Figure 4:
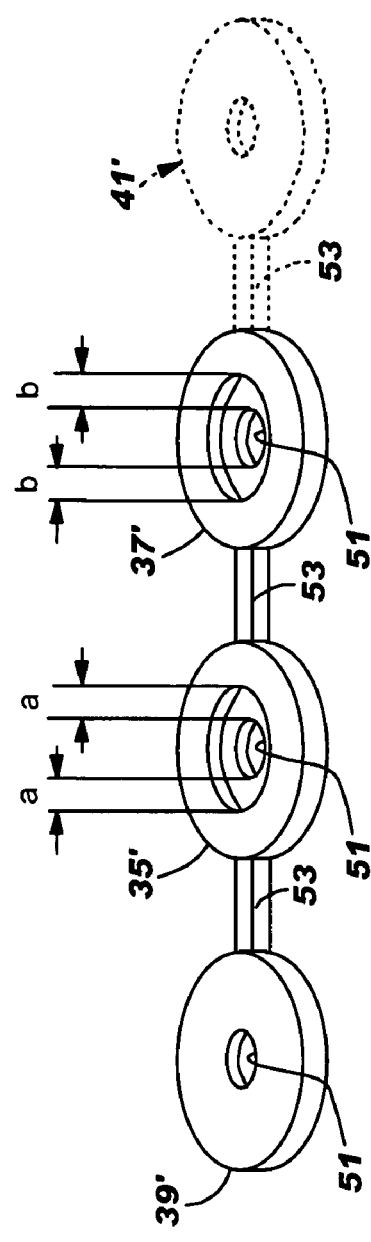
FIG. 4 shows one of the patterns in FIG. 3 after holes have been drilled therethrough, thus indicating possible acceptable tolerance values.

With both the first and second patterns 31 and 33 of apertured test pads in position and board 11 held in position, a plurality of equal diameter holes are drilled through the respective apertured pads and the corresponding auxiliary pads through the entire thickness of the board, or at least to the lowermost array of internal pads. In FIG. 4, one example of an internal pattern having such holes drilled therethrough is shown. This pattern includes a first plurality of the aforementioned pads 35', 37' and 39' and may further include additional apertured pads, i.e., 41' shown in phantom adjacent pad 37'. A common diameter hole 51 is drilled through each of the pads and the distance from the outer wall defining said opening to the internal wall of the pad's aperture is measured. With respect to pad 35', for example, this spacing is represented by the letter "a" while in the case of pad 37' this spacing, obviously smaller than that for pad 35', is represented by the letter "b". These spacings can otherwise be deemed to represent acceptable tolerance values for the respective pad through which the common diameter drill has been drilled. Each plurality of pads as shown in FIG. 4 is, in turn, associated with the respective patterns of openings (i.e., FIG. 8) of its respective conductive layer. That is, once the common drilling has occurred, if the tolerance values for pad 35' do not meet an acceptable level or fail to fall within a specified range (e.g., between "b" and "a"), this would indicate that a failure to meet the acceptable tolerance has occurred. This in turn typically means to the board manufacturer that the corresponding spacing of openings nearest this plurality of pads within active area 11 is improper and thus a problem may have occurred.

When testing for board 10, the outer patterns 31 are first tested for tolerance acceptability according a desired minimum required spacing, which is usually a set value but may be across a minimal, small established range. In one example, this tolerance may be established at only about 0.0055 inch.

Figure 5:
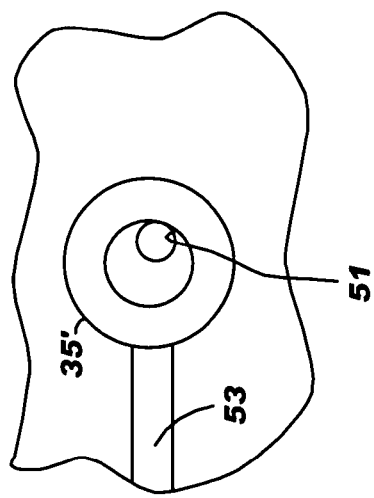
FIG. 5 illustrates the example where a drill engages the apertured pad of the pattern, resulting in an unacceptable breach of the desired tolerances.

In testing board 10, should one (or more) of the outer patterns 31 fail, the next step is to test the inner patterns 33 for tolerance acceptability according to an established range. In one example, this tolerance range may be from about 0.003 inch to about 0.008 inch, depending on the number of test apertured pads utilized, the spacing difference between each test pad, and the minimum required spacing. In FIG. 4, for example, assuming that the internal larger aperture for pad 35 possessed a diameter of 0.040 inch and the fill hole 51 was 0.030 inch, this would leave only a tolerance value "a" of 0.005 relative to the internal walls of the pad's opening. In comparison, value "b" may be 0.004 and thus less than "a". The plurality of pads shown in FIG. 4 is thus provided with a range, again depending on the number of aperture pads used, which in turn is associated with a corresponding acceptable range of a corresponding series or pattern of openings or contact sites or signal line-opening spacings within active area 11. In practice, should one of these inner patterns also fail, traditionally the entire board has been scrapped. FIG. 5 represents an example of where such a failure has occurred. As seen therein, pad 35' has been drilled and the corresponding opening 51 offset substantially (and thus well below the acceptable tolerance range) to the point where the drill has physically contacted the internal wall of the pad's opening. Failure is thus indicated because the pad 35' is electrically coupled to adjacent auxiliary pad 39' (FIG. 4), which in a preferred embodiment is a ground pad. A circuit is thus formed and a failure indication results therefrom. The connections between the pads are shown by the conductive lines 53.

Figure 7:
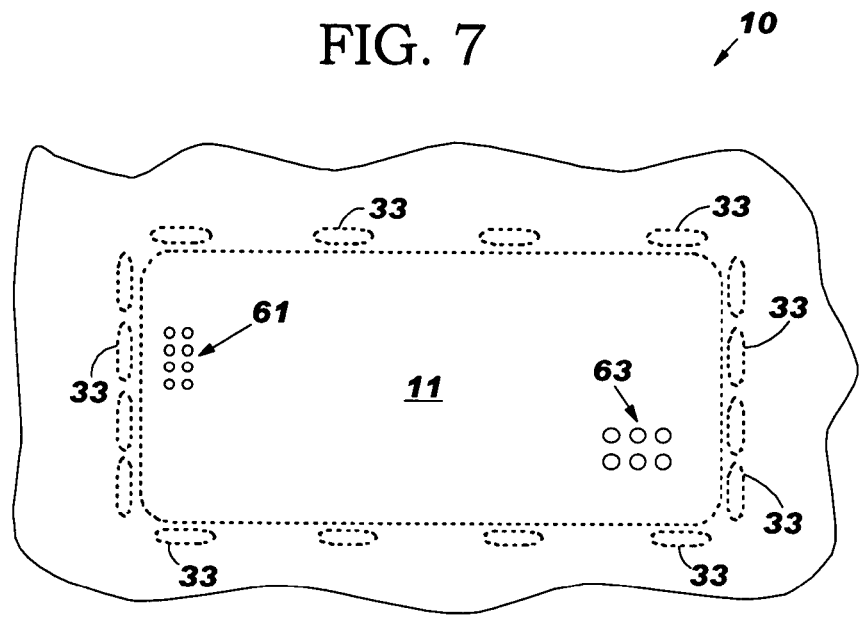
FIG. 7 is a partial plan view of a PCB showing two patterns of openings therein relative to a plurality of apertured test pad patterns located immediately adjacent and around the PCB's active area including the opening patterns.

If one or more of internal patterns 33, located clearly much closer to the respective opening patterns of area 11, fails, the normal procedure has been to scrap the board. In the instant invention, however, a significantly different procedure is utilized. Rather than scrap the board (and thus incur added costs), the respective pattern which fails is compared to see which of its assigned tolerance values were not satisfied. If this, for example, resulted in a failure of below 0.005 in the pattern of FIG. 4 but still above the value for pad 37', while the corresponding pattern of openings require an acceptable tolerance value of 0.005 inch, the next step in the test procedure is to locate the respective pattern (i.e., pattern 61 in FIG. 7) which in turn only required a tolerance value of less than 0.005 inch. Each PTH diameter has a minimum required spacing associated with it. The location of each pattern of PTH diameters with its respective tolerance is determined relative to the failing test pattern using a CAD drawing of the panel. A CAD drawing allows each pattern of PTH diameters to be highlighted to easily locate them. If the test pattern nearest this pattern (61) showed that the openings were of proper spacing, the board will not be scrapped but instead kept in production. In comparison, if the pattern closest to the respective test pattern indicating tolerance failure is shown not to meet the acceptable tolerance value of the immediately adjacent pattern 33, then the board must be scrapped. Thus, the test pattern closest to a non-applicable series of openings is not deemed acceptable to disqualify the complete board when in reality openings in a pattern much further away, which are shown to be acceptable, are the true test for board qualification. This new procedure has resulted in a substantial savings to the present manufacturer by allowing for tested boards to continue in production when these boards did not possess unacceptable opening patterns as was previously considered the case. Significantly less scrap is thus realized and a savings to the manufacturer has resulted therefrom.

In FIG. 6, there is shown an alternative embodiment of a test pattern of apertured test pads which may be utilized for the inner pattern 33. In FIG. 6, the pattern 33' is shown to include four apertured pads with two separate groupings, thus showing two pluralities of such pads. Each plurality includes the four illustrated apertured pads represented by the letters A–D and A'–D' respectively. Significantly, each plurality is separately electrically connected to the corresponding auxiliary (e.g., ground) pad E. Again, it is noted that the internal openings for the apertured pads are progressively smaller from left to right for each plurality. Thus, each apertured pad will have a different tolerance value to in turn provide a range of four different values across each plurality. In the pattern of FIG. 6, the four pads to the left are associated with the respective clearance openings in a conductive power plane associated with the pattern in FIG. 6 while the four apertured pads to the right are in turn associated with a corresponding signal line-opening spacing pattern which may also be found on the same conductive level as the power plane or instead thereof. The pattern in FIG. 6 is thus able to test for both possibilities in one conductive plane, whether it be a power or signal plane or a combination of both. As mentioned above, each apertured pad is drilled with a common diameter drill and the tolerance values for same determined. If the associated range for the opening patterns within the board's active area fail to satisfy the tolerance value range for the respective plurality of aperture test pads, the acceptance or rejection criteria defined above is utilized. Again, this means that the pattern farthest from a corresponding aperture pattern (i.e., pattern 33 to the lower right of area 11 in FIG. 7 versus the opening pattern 61 to the upper left in area 11) is not utilized to reject pattern 61 but instead the tolerance values taken from the pattern 33 immediately adjacent opening pattern 61 is compared. If the pattern immediately adjacent the opening pattern 61 is acceptable, the board is considered to pass. Similarly, if a test pattern along the upper periphery of board area 11 indicates a failure outside of an acceptable range and said range is assigned to the opening pattern 63, then the test pattern 33 immediately adjacent openings 63 is the final determining pattern for board acceptability.

The above pattern distinctions are necessary because in a multi-layered PCB as defined herein, wherein several layers of the PCB are laminated using relatively high temperatures and pressures associated with such manufacture, the internal layers may shift or otherwise become slightly displaced relative to one another and thus align improperly. Such misalignment can in fact result in subsequent PTH formation short circuiting or otherwise destroying the one or more of the internal conductive layers and thus rendering the board inoperable. The present invention represents a significant improvement in testing for such misalignment while still retaining acceptable PCBs that were heretofore deemed unacceptable and thus doomed for the scrap heap.

There has thus been shown and described a method of testing for opening patterns in a multi-layered, complex PCB such that precise patterns of signal lines, openings and conductive pads within the board's active area is assured or, if such alignment is not acceptable, correct determination thereof is achieved and only those boards failing to meet such acceptable criteria are removed from the production line. The method as described is attainable in a facile manner without extensive modification to existing PCB manufacturing equipment or testing software and is thus easily implemented by current PCB manufacturers.

While there have been shown and described what are at present the preferred embodiments of the invention, it will be obvious to those skilled in the art that various changes and modifications may be made therein without departing from the scope of the invention as defined by the appended claims.

What is claimed is:

1. A method of testing spacings in at least one pattern of openings in at least one conductive layer of a multilayered printed circuit board (PCB) to determine if said spacings meet acceptable criteria, said method comprising:
   providing a multilayered PCB including an active area having at least one internal conductive layer having at least one pattern of openings therein;
   providing a plurality of first patterns of apertured test pads spacedly positioned substantially along the outer periphery of said multilayered PCB externally of said active area;
   providing a plurality of second patterns of apertured test pads spacedly positioned substantially adjacent said active area of said multilayered PCB and closer to said active area than said plurality of first patterns of apertured pads;
   drilling a plurality of holes through said plurality of first patterns of apertured test pads to determine if each of said plurality of first patterns meet a first acceptable tolerance value;
   drilling a plurality of holes through said plurality of second patterns of apertured test pads to determine if each of said plurality of second patterns meet a second acceptable tolerance value;
   comparing said second acceptable tolerance value to an acceptable tolerance value assigned to said at least one pattern of openings in said active area of said multilayered PCB only if one or more of said first patterns of said apertured test pads fail to meet said first acceptable tolerance value; and
   determining whether said patterns of openings in said active area meet said acceptable criteria based solely on whether the second pattern of apertured test pads nearest said pattern of openings meets said second acceptable tolerance value and not on whether others of said second patterns of apertured test pads meet said second acceptable tolerance value.

2. The method of claim 1 wherein said at least one pattern of openings in said at least one internal conductive layer are clearance openings.

3. The method of claim 2 wherein said at least one internal conductive layer is a power plane.

4. The method of claim 1 wherein said at least one pattern of openings in said at least one conductive layer are positioned within said conductive layer relative to one or more conductive lines.

5. The method of claim 4 wherein said at least one conductive layer is a signal plane.

6. The method of claim 1 wherein the number of patterns of openings in said active area of said multilayered PCB is two, said pluralities of first and second patterns of apertured pads each comprised of a first plurality of conductive pads and a second plurality of conductive pads.

7. The method of claim 6 wherein said first plurality of conductive pads in each of said pluralities of first and second patterns is associated with one of said patterns of openings in said active area and said second plurality of conductive pads in each of said pluralities of first and second patterns is associated with the other of said patterns of openings in said active area.

8. The method of claim 7 wherein each of said pluralities of first and second patterns of apertured test pads further includes an auxiliary pad, each of said first plurality of conductive pads and each of said second plurality of conductive pads being separately electrically coupled to said auxiliary pad.

9. The method of claim 8 wherein said auxiliary pad is a ground pad.

10. The method of claim 1 wherein said first acceptable tolerance value for said plurality of first patterns of apertured test pads is set to a minimum required spacing value.

11. The method of claim 1 wherein said second acceptable tolerance range for said plurality of second patterns of apertured test pads is within a range of from about 0.003 inch to about 0.008 inch.

* * * * *